(12) United States Patent
Koike et al.

(10) Patent No.: US 6,552,376 B1
(45) Date of Patent: Apr. 22, 2003

(54) GROUP III NITRIDE COMPOUND SEMICONDUCTOR DEVICE

(75) Inventors: Masayoshi Koike, Aichi (JP); Shiro Yamasaki, Aichi (JP)

(73) Assignee: Toyoda Gosei Co., Ltd., Aichi-ken (JP)

( * ) Notice: Subject to any disclaimer, the term of this patent is extended or adjusted under 35 U.S.C. 154(b) by 0 days.

(21) Appl. No.: 09/654,492

(22) Filed: Sep. 1, 2000

(30) Foreign Application Priority Data

Sep. 1, 1999 (JP) .......................................... 11-247248

(51) Int. Cl.⁷ ............................................ H01L 31/072
(52) U.S. Cl. ........................ 257/201; 257/22; 257/94; 257/190; 438/503; 372/45
(58) Field of Search .......................... 372/45; 257/190, 257/94, 22; 438/503

(56) References Cited

U.S. PATENT DOCUMENTS 5,247,533 A * 9/1993 Okazaki et al. ............... 372/45
5,656,832 A * 8/1997 Ohba et al. .................. 257/190
5,693,963 A * 12/1997 Fujimoto et al. ............. 257/94
5,804,834 A * 9/1998 Shimoyama et al. .......... 257/22
6,110,809 A * 8/2000 Sze et al. ................... 438/503

FOREIGN PATENT DOCUMENTS

JP 10-150220 6/1998

* cited by examiner

*Primary Examiner*—David Nelms
*Assistant Examiner*—Mai-Huong Tran
(74) *Attorney, Agent, or Firm*—McGinn & Gibb, PLLC

(57) ABSTRACT

Aluminum gallium nitride ($Al_xGa_{1-x}N$, $0<x<1$) is employed as a substrate of a Group III nitride compound semiconductor device. In light-emitting diodes and laser diodes employing the substrate, crack generation is prevented, even when a thick cladding layer formed of aluminum gallium nitride ($Al_xGa_{1-x}N$, $0<x<1$) is stacked on the substrate. The smaller the difference in Al compositional proportion between the substrate and an aluminum gallium nitride ($Al_xGa_{1-x}N$, $0<x<1$) layer, the less likely the occurrence of crack generation.

15 Claims, 4 Drawing Sheets

US 6,552,376 B1

GROUP III NITRIDE COMPOUND SEMICONDUCTOR DEVICE

BACKGROUND OF THE INVENTION

1. Field of the Invention

The present invention relates to a Group III nitride compound semiconductor device and, more particularly, to a Group III nitride compound semiconductor device which functions as a light-emitting device.

2. Background Art

A Group III nitride compound semiconductor is one type of semiconductor used among direct transition types semiconductors, which have an emission spectrum widely ranging from ultraviolet to red. Thus, the semiconductor is employed in light-emitting devices such as light-emitting diodes (LEDs) or laser diodes (LDs). In a device fabricated by stacking Group III nitride compound semiconductor layers, a sapphire substrate is typically employed as a substrate in view (because) of proximity in lattice constant. FIGS. 3 and 4 show structures of the semiconductor devices.

Since sapphire is an electric insulator, stacked Group III nitride compound semiconductor layers are partially etched to form an n-type contact layer to thereby form a negative electrode. Then, a positive electrode is formed on a non-etched uppermost layer of the semiconductor. FIG. 3 shows a conventional light-emitting diode (LED) 900 employing Group III compound semiconductors. In the LED, an AlN buffer layer 902, an n-GaN n-contact layer 903, an n-$Al_xGa_{1-x}N$ n-cladding layer 904, an active layer (emission layer) 905 formed of a single layer or a preferably a multi-layer (single quantum well or multiple quantum well), a p-$Al_xGa_{1-x}N$ p-cladding layer 906, and a p-GaN p-contact layer 907 are formed on a sapphire substrate 901, in the order presented. A positive electrode 908A is formed on the p-contact layer 907 while a negative electrode 908B, developed through etching, is formed on a portion of the n-contact layer 903.

FIG. 4 shows a conventional laser diode (LD) 950 employing Group III compound semiconductors. In the LD, an AlN buffer layer 912, an n-GaN n-contact layer 913, an n-$Al_xGa_{1-x}N$ n-cladding layer 914, an n-GaN n-guide layer 915, an emission layer 916 formed, preferably of a multi-layer (multiple quantum well, MQW), a p-GaN p-guide layer 917, a p-$Al_xGa_{1-x}N$ p-cladding layer 918, and a p-GaN p-contact layer 919 are formed on a sapphire substrate 911, in the order presented. A positive electrode 920A is formed on the p-contact layer 919 while a negative electrode 920B, developed through etching, is formed on a portion of the n-contact layer 913.

However, the aforementioned conventional semiconductor has a drawback. Specifically, when a Group III nitride compound semiconductor is formed on a sapphire substrate, cracks are generated in a semiconductor layer, or a semiconductor layer bends, since elastic modulus and thermal expansion coefficient of the sapphire substrate differ from those of the Group III nitride compound semiconductor. Thus, the fabricated device has poor device characteristics. In addition, although the lattice constant of the sapphire substrate is approximately equal to that of the Group III nitride compound semiconductor, dislocations are readily generated due to misfit. Particularly, a cladding layer formed of $Al_xGa_{1-x}N$ attains a higher elastic modulus as the compositional proportion of Al (hereinafter simply referred to as "x") increases. Therefore, cracks are readily generated in such a cladding layer during a cooling process in production of a semiconductor device. As a result, the thickness of a cladding layer, which has a large compositional proportion of Al is limited to a low value. Such limitation in thickness is particularly detrimental to fabrication of laser diodes.

Employment o.f a sapphire substrate, which is an electric insulator, raises another limitation for fabricating semiconductor devices. Specifically, a positive electrode and a negative electrode must be disposed on a semiconductor-formed surface of a sapphire substrate.

SUMMARY OF THE INVENTION

In view of the foregoing disadvantages, an object of the present invention is to provide a Group III nitride compound semiconductor device in which generation of cracks in a semiconductor layer, bending of a semiconductor layer, and generation of misfit-induced dislocation in a semiconductor layer are prevented. Another object of the invention is to provide a Group III nitride compound semiconductor device employing a conductive substrate through which electricity is passed.

Accordingly, the present invention is directed to a Group III nitride compound semiconductor device comprising a substrate and one or more Group III nitride compound semiconductor layers formed on a first surface or first and second surface of the substrate, wherein aluminum gallium nitride ($Al_xGa_{1-x}N$, $0<x<1$) is employed as the substrate.

Preferably, among the Group III nitride compound semiconductor layers stacked on a first surface or first and second surfaces of a substrate, all layers 8, having a thickness of more than 10 nm, are independently formed of a compound represented by $Al_xGa_{1-x}N$, wherein $0 \leq x \leq 1$.

Preferably, each of the Group III nitride compound semiconductor layers stacked on a first surface or first and second surfaces of a substrate is formed of a compound represented by $Al_xGa_{1-x}N$, wherein $0 \leq x \leq 1$.

Preferably, a first layer of a Group III nitride compound semiconductor layer stacked on a first surface or a first and second surface of a substrate has a thickness of 1–20 µm, more preferably 2–20 µm.

A group III nitride compound semiconductor layer comprises binary compounds such as AlN, GaN, and InN. A group III nitride compound semiconductor layer also comprises ternary compounds such as $Al_xGa_{1-x}N$, $Al_xIn_{1-x}N$, and $Ga_xIn_{1-x}N$ ($0<x<1$). And a group III nitride compound semiconductor layer further comprises quaternary compounds such as $Al_xGa_yIn_{1-x-y}N$ ($0 \leq x \leq 1$, $0 \leq y \leq 1$, $0 \leq x+y \leq 1$). In the present invention, unless otherwise specified, the term "Group III nitride compound semiconductors" encompasses Group III nitride compound semiconductors per se and Group III nitride compound semiconductors doped with an impurity which causes the semiconductors to become either p- or n-conduction type semiconductors. Likewise, aluminum gallium nitride ($Al_xGa_{1-x}N$, $0<x<1$) also encompasses doped semiconductors.

BRIEF DESCRIPTION OF THE DRAWINGS

Various other objects, features, and many of the attendant advantages of the present invention will be readily appreciated as the same becomes better understood with reference to the following detailed description of the preferred embodiments when considered in connection with accompanying drawings, in which.

Figure 1:
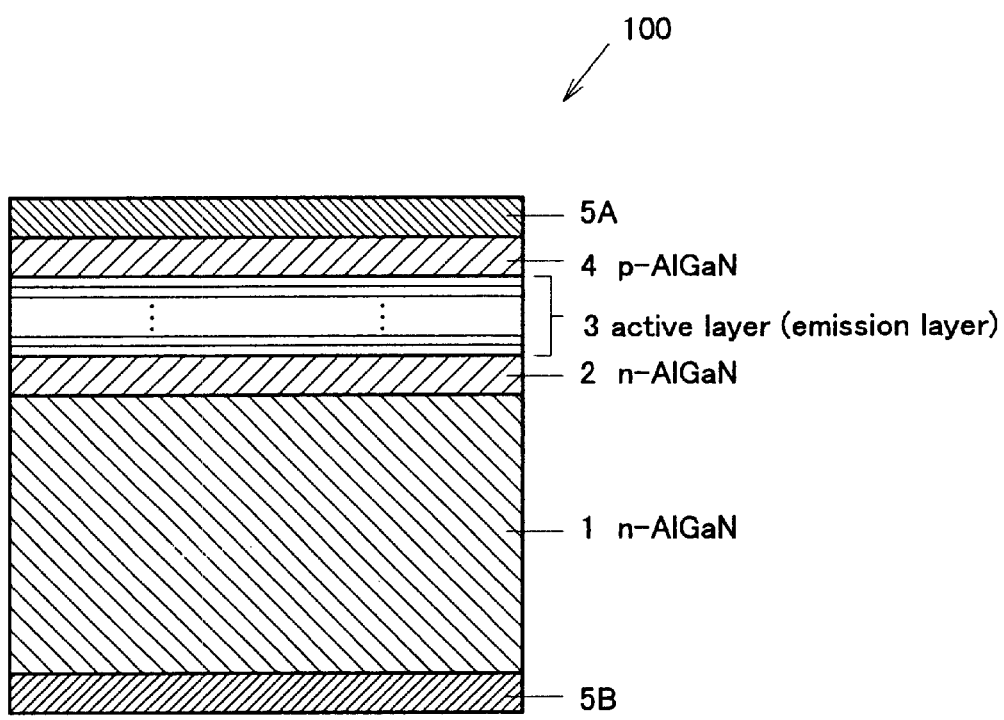
FIG. 1 is a schematic cross-sectional view of the structure of a Group III nitride compound semiconductor device according to a first embodiment of the present invention.

DETAILED DESCRIPTION OF PREFERRED EMBODIMENTS;

A Group III nitride compound semiconductor device such as a light-emitting device is produced by doping an appropriate impurity to a Group III nitride semiconductor component layer represented by $Al_xGa_yIn_{1-x-y}N$ ($0 \leq x \leq 1$; $0 \leq x+y \leq 1$). As discussed above with regard to the semiconductor layers, cracks are readily generated in an aluminum gallium nitride ($Al_xGa_{1-x}N$, $0<x<1$) layer when the layer is formed so as to have a large thickness since an employed sapphire substrate has an elastic modulus and thermal expansion coefficient greatly different from those of the aluminum gallium nitride ($Al_xGa_{1-x}N$, $0<x<1$) layer. Thus, when a substrate in which x is equal or nearly equal to x in an aluminum gallium nitride ($Al_xGa_{1-x}N$, $0<x<1$) layer to be formed in the device, the difference in elastic modulus and thermal expansion coefficient between the substrate and the semiconductor layer can be suppressed to a low level. Accordingly, even when a substrate has a thickness of 50 μm or more, further 100 μm or more, or an aluminum gallium nitride ($Al_xGa_{1-x}N$, $0<x<1$) cladding layer is formed so as to have a thickness of 1 μm or more, no cracks are generated, due to small difference in elastic modulus and thermal expansion coefficient between the substrate and a Group III nitride semiconductor component layer. The cladding layer preferably has a thickness of 1 μm or more in view of ensuring the crystallinity of a layer formed thereon. In connection with the upper limit, the thickness is preferably 20 μm or less, more preferably 2–10 μm, in view of productivity of devices.

When each Group III nitride compound semiconductor layer is formed from $Al_xGa_{1-x}N$ ($0 \leq x \leq 1$); such as, gallium nitride, aluminum gallium nitride, or aluminum nitride, the overall thickness of the stacked layers is approximately 20 μm. In such a semiconductor, the formation of cracks, induced by the difference in the elastic modulus and thermal expansion coefficient between the substrate and a Group III nitride semiconductor component layer can be prevented. When an emission layer of a light-emitting device is formed of a multiple quantum well, a well layer and a barrier layer, the emission layer may be sufficiently thin and does not have to be formed of $Al_xGa_{1-x}N$ ($0 \leq x \leq 1$). Such a mode is also included within the scope of the invention. The aforementioned Group III nitride compound semiconductor devices are particularly preferred as light-emitting devices, such as light-emitting diodes (LEDs) and laser diodes (LDs), which require a long service life. Specifically, in the production of an LD, when a thick cladding layer is formed from an aluminum gallium nitride $Al_xGa_{1-x}N$ ($0<x<1$) and the x of an aluminum gallium nitride $Al_xGa_{1-x}N$ ($0<x<1$) substrate in which x is equal or nearly equal to x in the cladding layer, there can readily be prevented cracks induced by difference in elastic modulus and thermal expansion coefficient between the substrate and a Group III nitride semiconductor component layer. In this case, when the 'x' of the cladding layer coincides with the 'x' of the substrate, the 'x' can be elevated and all semiconductor component layers can contain aluminum. Furthermore, when aluminum gallium nitride $Al_xGa_{1-x}N$ ($0<x<1$) having a desired electric conductivity is employed as a substrate, a Group III nitride compound semiconductor light-emitting device is produced in which electricity is passed via the aluminum gallium substrate.

The Group III nitride compound semiconductor device of the present invention may also be adapted to power devices and light-emitting devices other than LEDs and LDs. When a contact electrode is formed on a substrate, a Si-doped GaN contact layer may be formed so as to lower the contact resistance. Semiconductor component layers may also be formed of a composition-graded layer; e.g., from GaN to $Al_xGa_{1-x}N$.

The present invention will next be described in detail with reference to specific embodiments, which should not be construed as limiting the invention thereto.

First Embodiment

A light-emitting diode 100 having a structure shown in FIG. 1 was produced. The LED 100 contains an n-type $Al_{0.07}Ga_{0.93}N$ substrate 1 having a thickness of approximately 100 μm and an electron density of $3 \times 10^{17}/cm^3$.

The following layers were formed on the n-type $Al_{0.07}Ga_{0.93}N$ substrate 1, in the order presented, an Si-doped $Al_{0.07}Ga_{0.93}N$ n-type cladding layer 2 having a thickness of approximately 0.5 μm and an electron density of $2 \times 10^{18}/cm^3$; a GaN active layer 3 having a thickness of 50 nm; an Mg-doped $Al_{0.07}Ga_{0.93}N$ p-type cladding layer 4 having a thickness of approximately 0.5 μm and a hole density of $5 \times 10^{17}/cm^3$. A metal electrode 5A was formed on the cladding layer 4, and a metal electrode 5B was formed on the entire backside of the n-type $Al_{0.07}Ga_{0.93}N$ substrate 1.

The metal electrode 5A, serving as a positive electrode, was formed from gold (Au). Alternatively, the electrode may be formed from Au-Co alloy, Au-Ni alloy, Au-other metal alloy, or a multi-layer thereof. The metal electrode 5B, serving as a negative electrode, was formed from aluminum (Al). Alternatively, the electrode may be formed from Al-V alloy, Al-Ti alloy, Al-other metal alloy, or a multi-layer thereof.

A method for producing the light-emitting diode 100 shown in FIG. 1 will next be described. In practice, the $Al_{0.07}Ga_{0.93}N$ substrate 1 was produced by epitaxially growing $Al_{0.07}Ga_{0.93}N$ on a silicon (Si) substrate employing a halide source and removing the silicon Si substrate. More specifically, a silicon (Si) substrate was placed in a chamber equipped with a halogen source-supplier. The chamber was evacuated, and nitrogen ($N_2$) was fed into the chamber. The atmosphere was heated to 1000° C., to thereby cause gallium (Ga) and aluminum (Al) to react with hydrogen chloride (HCl). The chloride formed was supplied to the Si substrate, while ammonia ($NH_3$) was introduced to the chamber, thereby forming $Al_{0.07}Ga_{0.93}N$ on the Si substrate.

The Si substrate was removed through mechanical polishing using diamond particles and mechanochemical polishing that employs colloidal silica particles in an alkaline medium, to thereby obtain the n-type $Al_{0.07}Ga_{0.93}N$ substrate 1 having an electron density of $3 \times 10^{17}/cm^3$ and a thickness of 100 μm. Alternatively, the n-type $Al_{0.07}Ga_{0.93}N$ substrate 1 may be obtained by removing an Si substrate through wet-etching.

A method for producing the component layers of the light-emitting diode 100 of the invention will next be described. The light-emitting diode 100 was produced through a vapor phase growth method such as, metal:organic vapor phase epitaxy (MOVPE). Employed gases were ammonia ($NH_3$), carrier gases ($N_2$ or $H_2$), trimethylgallium (Ga($CH_3$)$_3$, hereinafter abbreviated as TMG), trimethylaluminum (Al($CH_3$)$_3$, hereinafter abbreviated as TMA), trimethylindium (In($CH_3$)$_3$, hereinafter abbreviated as TMI), silane ($SiH_4$), and cyclopentadienylmagnesium (Mg($C_5H_5$)$_2$, hereinafter abbreviated as $CP_2Mg$).

Initially, an n-type $Al_{0.07}Ga_{0.93}N$ substrate 1 was placed on a susceptor disposed in a reaction chamber of an MOVPE apparatus, and the temperature of the substrate was maintained at 1000° C. A carrier gas (10 L/min), ammonia ($NH_3$) (10 L/min), TMG (100 μmol/min), TMA (5 μmol/min), and silane ($SiH_4$, diluted to 0.86 ppm with hydrogen) (5 nmol/min) were fed to the chamber, to thereby form an Si-doped $Al_{0.07}Ga_{0.93}N$ n-type cladding layer 2 having a thickness of approximately 0.5 μm and an electron density of $2\times10^{18}/cm^3$. Subsequently, a carrier gas (10 L/min), ammonia ($NH_3$) (10 L/min), and TMG (20 μmol/min) were fed to the chamber, to thereby form a GaN active layer 3. Subsequently, a carrier gas (10 L/min), ammonia ($NH_3$) (10 L/min), TMG (100 μmol/min), TMA (5 μmol/min), and $CP_2Mg$ (2 μmol/min) were fed into the chamber, to thereby form an Mg-doped $Al_{0.07}Ga_{0.93}N$ p-type cladding layer 4 having a thickness of approximately 0.5 μm. The cladding layer 4 was irradiated with an electron beam so as to lower electric resistance of the layer, thereby causing a p-type cladding layer 4 to have a hole density of $5\times10^{17}cm^3$. Gold (Au) was vapor-deposited on the p-type cladding layer 4 to form a positive electrode, and aluminum (Al) was vapor-deposited on the backside of the n-type $Al_{0.07}Ga_{0.93}N$ substrate 1 to form a negative electrode.

The thus-produced light-emitting diode 100 exhibited an emission peak wavelength of 365 nm.

Figure 3:
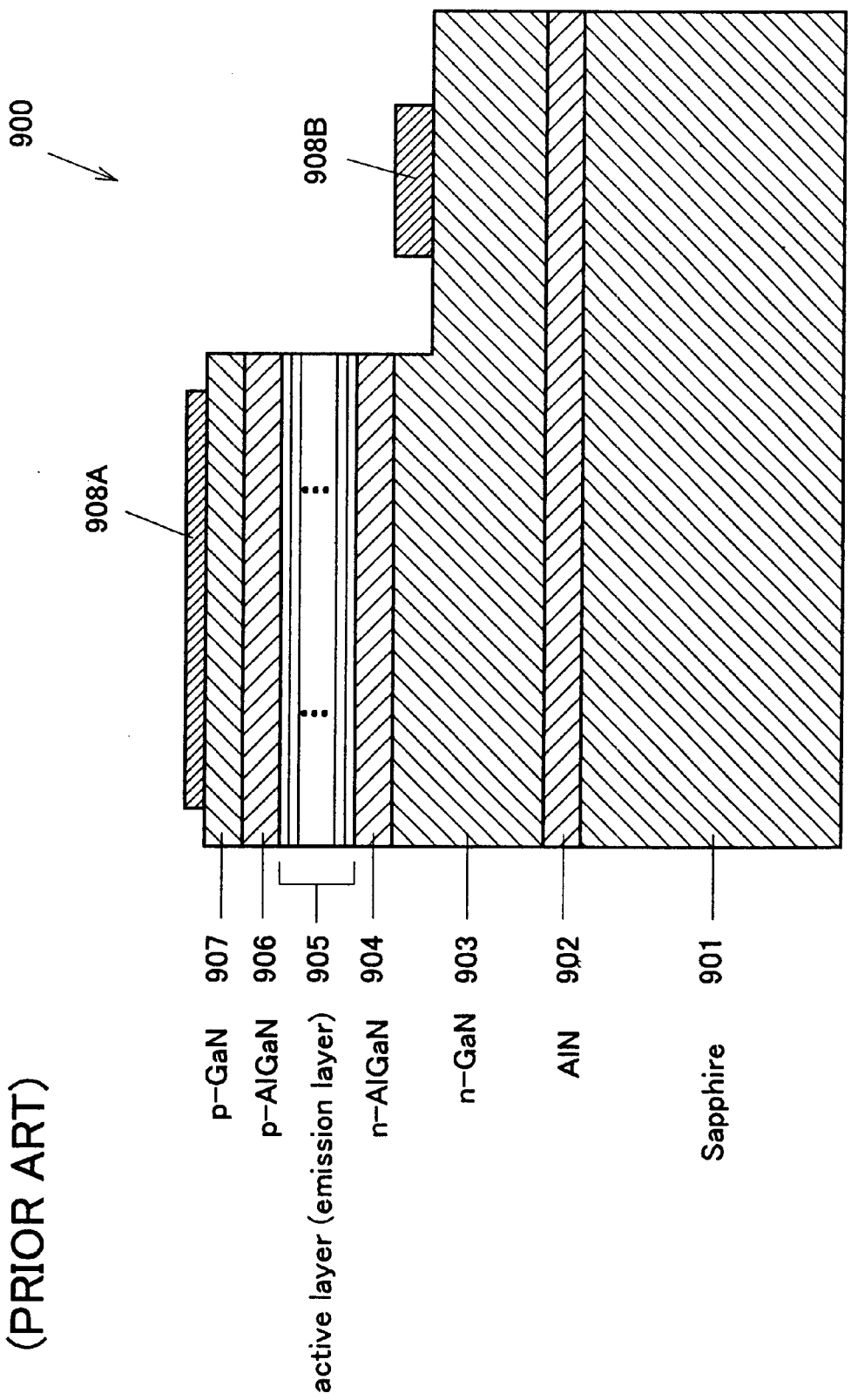
FIG. 3 is a schematic cross-sectional view of the structure of a conventional light-emitting diode comprising a Group III nitride compound semiconductor.

The light-emitting diode 100 shown in FIG. 1 has the emission layer sandwiched between the positive electrode 5A and the negative electrode 5B. Comparing FIGS. 1 and 3, an etching step for exposing the n-type contact layer 903 included in the conventional light-emitting diode 900 can be omitted. As a result, the number of layers to be formed can be reduced. In addition, the metal electrode contact area (ohmic contact area) of the positive and negative electrodes can be enhanced.

Second Embodiment

Figure 2:
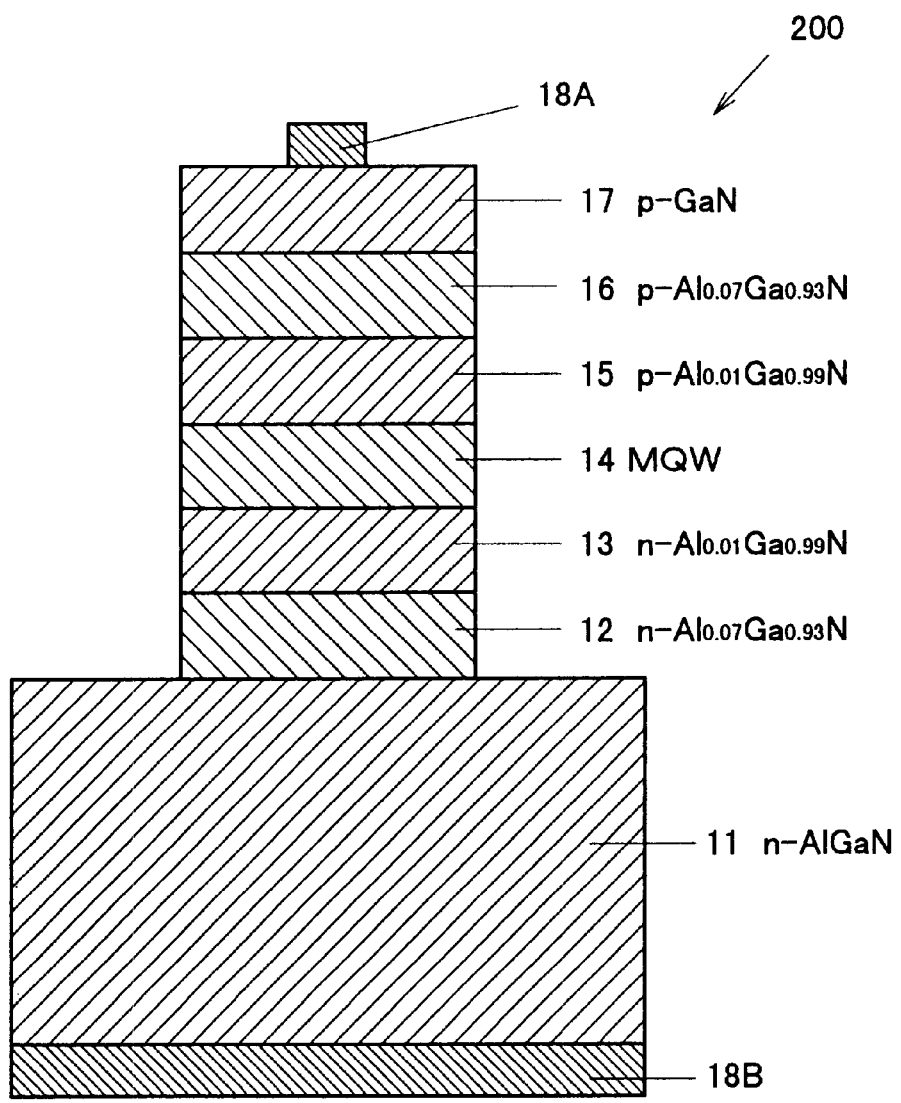
FIG. 2 is a schematic cross-sectional view of the structure of a Group III nitride compound semiconductor device according to a second embodiment of the present invention.

A laser diode 200 having a structure shown in FIG. 2 was produced. The LD 200 contains an n-type $Al_{0.07}Ga_{0.93}N$ substrate 11 having a thickness of approximately 100 μm and an electron density of $3\times10^{17}/cm^3$.

On the n-type $Al_{0.07}Ga_{0.93}N$ substrate 11 were formed, in the order given, an Si-doped $Al_{0.07}Ga_{0.93}N$ n-type cladding layer 12 having a thickness of approximately 3 μm and an electron density of $2\times10^{18}$ /cm3; an Si-doped $Al_{0.01}Ga_{0.99}N$ n-type guide layer 13 having a thickness of approximately 0.5 μm and an electron density of $5\times10^{17}/cm^3$; an emission layer 14 of a multiple quantum well (MQW) structure comprising five GaN well layers each having a thickness of 2 nm stacked alternately with six $Al_{0.01}Ga_{0.99}N$ barrier layers each having a thickness of 5 nm; an Mg-doped $Al_{0.01}Ga_{0.99}N$ p-type guide layer 15 having a thickness of approximately 0.5 μm and a hole density of $5\times10^{17}/cm^3$; an Mg-doped $Al_{0.07}Ga_{0.93}N$ p-type cladding layer 16 having a thickness of approximately 1 μm and a hole density of $5\times10^{17}/cm^3$; and Mg-doped GaN p-type contact layer 17 having a thickness of approximately 0.2 μm and a hole density of $7\times10^{17}/cm^3$. A metal electrode 18A was formed on the p-type contact layer 17, and a metal electrode 18B was formed on the entire backside of the n-type $Al_{0.07}Ga_{0.93}N$ substrate 11.

The laser diode 200 of the second embodiment was produced, on the n-type n-type $Al_{0.07}Ga_{0.93}N$ substrate 11 through a metal organic vapor phase epitaxy (MOVPE) method, in a manner similar to that described in the first embodiment. Specifically, an n-type $Al_{0.07}Ga_{0.93}N$ substrate 11 was placed on a susceptor disposed in a reaction chamber of an MOVPE apparatus, and the temperature of the substrate was maintained at 1000° C. A carrier gas (10 L/min), ammonia ($NH_3$) (10 L/min), TMG (100 μmol/min), TMA (5 μmol/min), and silane ($SiH_4$, diluted to 0.86 ppm with hydrogen) (5 nmol/min) were fed into the chamber, to thereby form an Si-doped $Al_{0.07}Ga_{0.93}N$ n-type cladding layer 12 having a thickness of approximately 3 μm and an electron density of $2\times10^{18}/cm^3$. Subsequently, a carrier gas (10 L/min), ammonia ($NH_3$) (10 L/min), TMG (50 μmol/min), and TMA (1 μmol/min) were fed to the chamber, to thereby form an Si-doped $Al_{0.01}Ga_{0.99}N$ n-type guide layer 13 having a thickness of 0.5 μm and an electron density of $5\times10^{17}/cm^3$. Subsequently, the emission layer 14 of a multiple quantum well (MQW) structure was formed. The MQW layer comprises five GaN well layers stacked alternately with six $Al_{0.01}Ga_{0.99}N$ barrier layers. Specifically, GaN well layers each having a thickness of 2 μm are formed by feeding ammonia ($NH_3$), TMG, and $Al_{0.01}Ga_{0.99}N$ barrier layers each having a thickness of 5 nm were formed by feeding ammonia ($NH_3$), TMG, and TMA.

Subsequently, a carrier gas (10 L/min), ammonia ($NH_3$) (10 L/min), TMG (50 μmol/min), TMA (1 μmol/min), and $CP_2Mg$ (2 μmol/min) were fed to the chamber, to thereby form an Mg-doped $Al_{0.09}Ga_{0.99}N$ p-type guide layer 15 having a thickness of approximately 0.5 μm. Subsequently, a carrier gas (10 L/min), ammonia ($NH_3$) (10 L/min), TMG (50 μmol/min), TMA (5 μmol/min), and $CP_2Mg$ (2 μmol/min) were fed to the chamber, to thereby form an Mg-doped $Al_{0.07}Ga_{0.93}N$ p-type cladding layer 16 having a thickness of approximately 1 μm. Subsequently, a carrier gas (10 L/min), ammonia ($NH_3$) (10 L/min), TMG (100 μmol/min), and $CP_2Mg$ (2 μmol/min) were fed to the chamber, to thereby form an Mg-doped GaN p-type contact layer 17 having a thickness of approximately 0.2 μm. The p-type contact layer 17, the p-type cladding layer 16, and the p-type guide layer were irradiated with an electron beam so as to lower electric resistance thereof, thereby causing the layers to have hole densities of $7\times10^{17}/cm^3$, $5\times10^{17}/cm^3$, and $5\times10^{17}/cm^3$, respectively. Gold (Au) was vapor-deposited on the p-type contact layer 17 to form a positive electrode 18A, and aluminum (Al) was vapor-deposited on the backside of the n-type $Al_{0.07}Ga_{0.93}N$ substrate 11 to form a negative electrode 18B.

Figure 4:
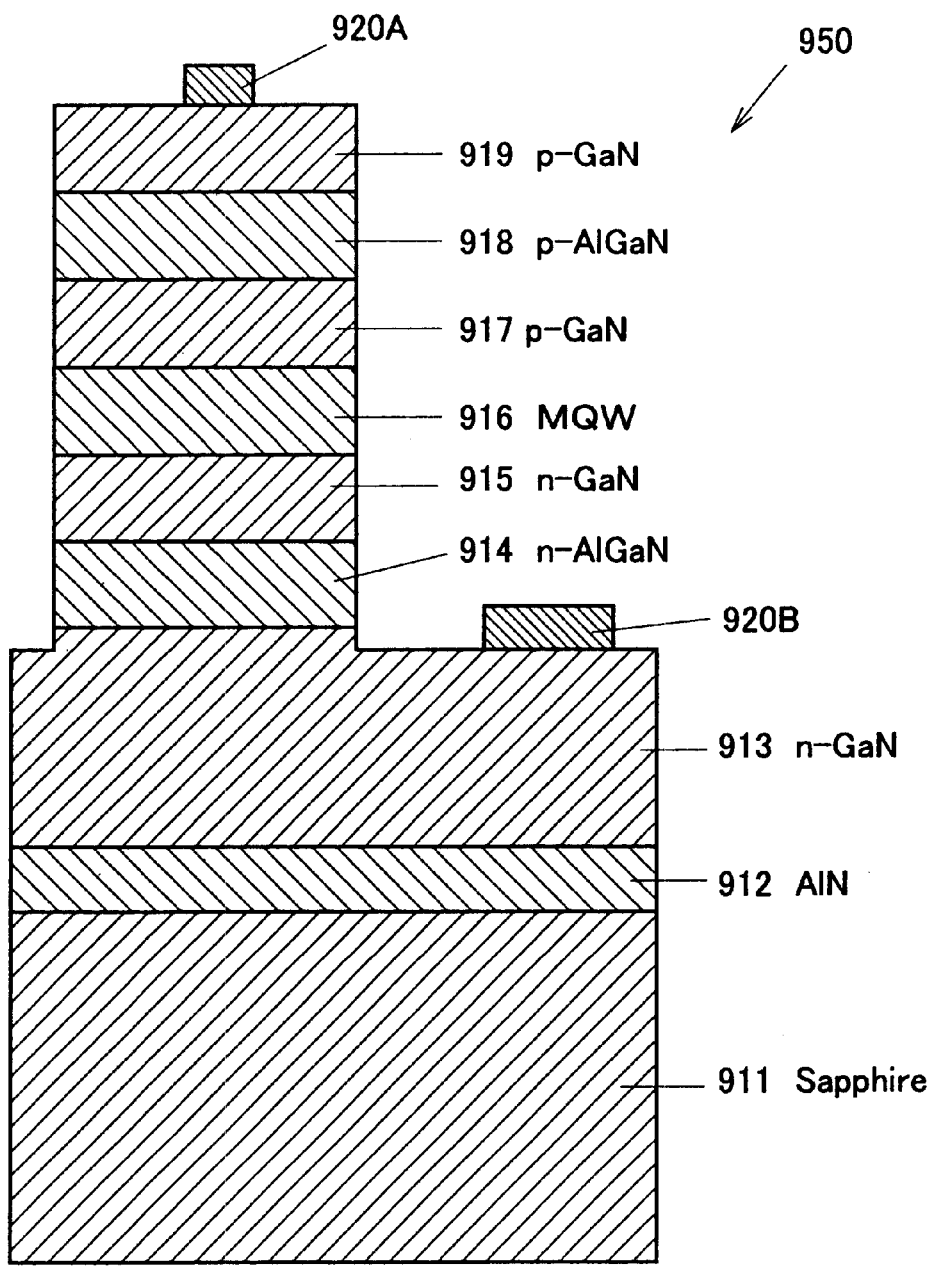
FIG. 4 is a schematic cross-sectional view of the structure of a conventional laser diode comprising a Group III nitride compound semiconductor.

In contrast to a conventional laser diode such as the laser diode 950 shown in FIG. 4, cracks were not generated in the thus-produced laser diode 200, despite the n-type cladding layer 12 formed therein having a thickness as large as approximately 3 μm. The threshold current of the laser diode 200 of the present invention is 100 mA, whereas the conventional laser diode 950 has a threshold current of 200 mA. The reason for the decrease in threshold current is thought to be enhancement in the light confinement due to an absence of cracks. In the laser diode 200, facets having a mirror surface can readily be attained through cleavage. In addition, electric current can be caused to flow from the p-type GaN contact layer 17 to the substrate 11, to thereby omit an n-type GaN contact layer and enhance the metal electrode contact area (ohmic contact area) of the negative electrode.

In the above-described embodiments, a silicon substrate was employed for forming the $Al_{0.07}Ga_{0.93}N$ substrate through halide epitaxy. However, other substrates, such as silicon carbide (SiC), gallium phosphide (GaP), and sapphire, may also be employed. Although in the above-described embodiments, Group III nitride compound semiconductor layers are formed on the $Al_{0.07}Ga_{0.93}N$ substrate through metal organic chemical vapor deposition (MOCVD), other vapor phase growth methods, such as molecular-beam epitaxy (MBE), halide vapor phase epitaxy (Halide VPE), and liquid-phase epitaxy (LPE) may also be employed.

The structure of the light-emitting device is not particularly limited, and the device may have a homo-, hetero-, or double-hetero-structure. These structures may be formed via an MIS junction, a PIN junction, or a pn junction. The emission (active) layer may have any quantum well structure, for example, a single-quantum well (SQW) structure, or a multiple quantum well (MQW) structure which comprises well layers and barrier layers having a band gap higher than that of a well layer.

In the present invention, Group III Elements in the Group III nitride compound semiconductors may be partially substituted by boron (B) or thallium (Tl), and nitrogen atoms may be partially substituted by phosphorus (P), arsenic (As), antimony (Sb), or bismuth (Bi). When these semiconductors are used in light-emitting devices, 2-component or 3-component Group III nitride semiconductors are preferred.

In the first and second embodiments of the invention, the backside of the substrate is formed from a metallic negative electrode 5B or 18B. The metal electrode may further be coated with another layer. For example, in a light-emitting diode, a light-reflecting layer may be formed on the backside metal layer in order to enhance light extraction efficiency. Examples of preferred metals for forming the light-reflecting layer include Al, In, Cu, Ag, Pt, Ir, Pd, Rh, W, Mo, Ti, and Ni. These metals may be used singularly or in combination of two or more species, for instance, in the form of an alloy. The metallic light-reflecting layer having the same construction as above may be disposed on the positive electrode side; for example, in a light-emitting diode.

In the above embodiments, the $Al_{0.07}Ga_{0.93}N$ conductive substrate was obtained without doping. However, an n-type $Al_xGa_{1-x}N$ substrate having a controlled conductivity may be formed by using silane ($SiH_4$) to dope silicon (Si), and a Group III nitride compound semiconductor device may be formed thereon. In the embodiments described above, the compositional proportion of aluminum of the substrate 1 or 11; the cladding layer 2, 4, 12, or 16; the guide layer 13 or 15; or the barrier layer in MQW represents a typical example. Thus, any material that satisfies the formula $Al_xGa_{1-x}N$ ($0 \leq x \leq 1$) may be employed. In such a case, the proportion 'x' may be varied accordingly in the components semiconductor layers.

In addition, the light-emitting devices of the above embodiments were fabricated such that electricity passes, through the $Al_xGa_{1-x}N$ substrate. Alternatively, both the positive electrode and the negative electrode may be disposed on the top surface of the various device layers. Since one of the important features of the invention is employment of an $Al_xGa_{1-x}N$ substrate in which 'x' is approximately equal to 'x' in a Group III nitride compound semiconductor layer characterized by having a high value of 'x', the positions for disposing electrodes are not limited.

While the invention has been described in terms of a certain preferred embodiment, other embodiments apparent to those of ordinary skill in the are also within the scope of to this invention. Accordingly, the scope of the invention is intended to be defined only by the claims that follow.

What is claimed is:

1. A Group III nitride compound semiconductor device comprising a substrate and one or more Group III nitride compound semiconductor layers on first and second surfaces of the substrate, wherein aluminum gallium nitride satisfying the formula ($Al_xGa_{1-x}N$, $0<x<1$) is employed as the substrate.

2. A Group III nitride compound semiconductor device according to claim 1, wherein among the Group III nitride compound semiconductor layers stacked on the first and second surfaces of the substrate, all layers having a thickness of more than 10 nm are independently formed of a compound represented $Al_xGa_{1-x}N$, wherein $0 \leq x \leq 1$.

3. A Group III nitride compound semiconductor device according to claim 2, wherein each of the one or more Group III nitride compound semiconductor layers stacked on the first and second surfaces of the substrate is formed of a compound represented by $Al_xGa_{1-x}N$, wherein $0 \leq x \leq 1$.

4. A Group III nitride compound semiconductor device according to claim 2, wherein a first layer of the Group III nitride compound semiconductor layers stacked on the first and second surfaces of the substrate has a thickness of 1–20 μm.

5. A Group III nitride compound semiconductor device according to claim 1, wherein each of the one or more Group III nitride compound semiconductor layers stacked on the first and second surfaces of the substrate is formed of a compound represented by $Al_xGa_{1-x}N$, wherein $0 \leq x \leq 1$.

6. A Group III nitride compound semiconductor device according to claim 1, wherein a first layer of the one or more Group III nitride compound semiconductor layers stacked on the first and second surfaces of the substrate has a thickness of 1–20 μm.

7. A Group III nitride compound semiconductor device according to claim 1, wherein a first layer of the one or more Group III nitride compound semiconductor layers stacked on the first and second surfaces of the substrate has a thickness of 2–10 μm.

8. A Group III nitride compound semiconductor device comprising a substrate and one or more Group III nitride compound semiconductor layers on a first surface or first and second surfaces of the substrate, wherein aluminum gallium nitride ($Al_{x1}Ga_{1-x1}N$, $0<x1<1$) is employed as the substrate and aluminum gallium nitride ($Al_xGa_{1-x}N$, $0<x<1$) is employed as the at least one layer in said Group III nitride compound semiconductor layers and further wherein x1 is equal or nearly equal to x.

9. A Group III nitride compound semiconductor device according to claim 8, wherein among the Group III nitride compound semiconductor layers stacked on the first surface or first and second surfaces of the substrate, all layers having a thickness of more than 10 nm are independently formed of a compound represented by $Al_xGa_{1-x}N$, wherein $0 \leq x \leq 1$.

10. A Group III nitride compound semiconductor device according to claim 8, wherein each of the Group III nitride compound semiconductor layers stacked on the first surface or first and second surfaces of the substrate is formed of a compound represented by $Al_xGa_{1-x}N$, wherein $0 \leq x \leq 1$.

11. A Group III nitride compound semiconductor device according to claim 8, wherein a first layer of the Group III nitride compound semiconductor layers stacked on the first surface or first and second surfaces of the substrate has a thickness of 1–20 μm.

12. A Group III nitride compound semiconductor device according to claim 8, wherein a first layer of the Group III nitride compound semiconductor layers stacked on the first surface or first and second surfaces of the substrate has a thickness of 2–10 μm.

13. A Group III nitride compound semiconductor device according to claim 8, wherein said substrate is electrically conductive.

14. A Group III nitride compound semiconductor device according to claim 13, wherein said at least one layer is a cladding layer.

15. A Group III nitride compound semiconductor device according to claim 8, wherein said at least one layer is a cladding layer.

* * * * *